United States Patent [19]

Huijsing et al.

[11] Patent Number: 4,555,673

[45] Date of Patent: Nov. 26, 1985

[54] DIFFERENTIAL AMPLIFIER WITH RAIL-TO-RAIL INPUT CAPABILITY AND CONTROLLED TRANSCONDUCTANCE

[75] Inventors: Johan H. Huijsing, Den Hoorn ZH, Netherlands; Rudy J. van de Plassche, Cupertino, Calif.

[73] Assignee: Signetics Corporation, Sunnyvale, Calif.

[21] Appl. No.: 602,231

[22] Filed: Apr. 19, 1984

[51] Int. Cl.$^4$ .............................................. H03F 3/45
[52] U.S. Cl. .................................... 330/258; 330/252; 330/257
[58] Field of Search ............... 330/252, 253, 258, 261, 330/257

[56] References Cited

U.S. PATENT DOCUMENTS

| | | | |
|---|---|---|---|
| 4,333,058 | 6/1982 | Hoover | 330/253 |
| 4,357,578 | 11/1982 | Yokoyama | 330/252 |
| 4,377,789 | 3/1983 | Hoover | 330/253 |

OTHER PUBLICATIONS

"Linear & Data Acquisition Products", Data Manual, vol. 1, Harris Corp., 1977, pp. 2-59, 2-79.

"Analog: Data Acquisition, Communications, Linear", Data Manual, vol. 3, Harris Corp 1982, pp. 2-29, 2-78.

*Primary Examiner*—James B. Mullins
*Assistant Examiner*—G. Wan
*Attorney, Agent, or Firm*—R. J. Meetin; R. Mayer; T. A. Briody

[57] ABSTRACT

A differential amplifier operable between a pair of supply voltages that define a rail-to-rail supply range contains a pair of differential portions (20 and 22) that together provide representative signal amplification across the supply range, although neither differential portion individually does so. A current control (24) regulates operating currents ($I_N$ and $I_p$) for the differential portions in such a way that the amplifier transconductance can be controlled in a desired manner as the common-mode part ($V_{CM}$) of the amplifier input signal ($V_{I+}$ and $V_{I-}$) varies across the supply range. The transconductance is typically controlled to be largely constant. A summing circuit (26) selectively combines internal currents ($I_A$, $I_B$, $I_C$, and $I_D$) from the differential portions to generate at least one output signal ($I_{O+}$ and $I_{O-}$) representative of the input signal.

24 Claims, 12 Drawing Figures

4,555,673

DIFFERENTIAL AMPLIFIER WITH RAIL-TO-RAIL INPUT CAPABILITY AND CONTROLLED TRANSCONDUCTANCE

FIELD OF USE

This invention relates generally to differential amplifiers suitable for operational amplifiers made in semiconductor integrated circuit form and particularly to differential amplifiers employing pairs of transistors to achieve rail-to-rail input capability.

BACKGROUND ART

It is often desirable that an operational amplifier ("op amp") utilize a low power supply voltage. This severely constrains the voltage range of the common-mode part of the differential input signal supplied to many prior art bipolar op amps, particularly those whose input stage is a differential amplifier. In many cases, the common-mode voltage $V_{CM}$ of the input signal cannot use the entire range of the power supply voltage.

One way for extending the $V_{CM}$ range to the full supply range is to utilize complementary pairs of input transistors. This technique is used in the differential amplifier input section of the op amp in the Signetics NE660 integrated circuit. FIG. 1 shows the Signetics NE660 differential amplifier as, for example, disclosed in U.S. patent application Ser. No. 525,181, filed Aug. 23, 1983, now U.S. Pat. 4,532,479.

This amplifier has a differential input section containing complementary differential portions 10 and 12 which amplify the differential input signal defined by voltages $V_{I+}$ and $V_{I-}$. Voltage $V_{I+}$ is $V_{CM}+\Delta V$, and voltage $V_{I-}$ is $V_{CM}-\Delta V$, where $2\Delta V$ is the differential part of the input signal. Current sources 14 and 16 respectively connected to points (or terminals) of low and high supply voltages $V_L$ and $V_H$ provide the supply current for the input section.

The input section is connected to a summing circuit 18 containing transistors QA, QB, QC, and QD configured as shown in FIG. 1. Equal-valued resistors RA, RB, RC, and RD are also part of circuit 18. As described more fully in the foregoing patent application, circuit 18 is a modulated current mirror for combining signal currents from differential portions 10 and 12 to provide an output current $I_O$.

The range for the power supply voltage $V_{PS}$—i.e., $V_H-V_L$—is divided into three ranges. A low range goes from $V_L$ up to slightly more than $V_L+V_{BE}$, where $V_{BE}$ is the absolute value of the standard base-to-emitter voltage of a bipolar transistor when it is just turned on. A high range goes from $V_H$ down to slightly less than $V_H-V_{BE}$. With $V_{PS}$ being greater than $2V_{BE}$, a middle range extends between the two end ranges.

Differential portion 10 contains NPN transistors Q1 and Q2 which amplify the input signal by dividing operating current provided from current source 14 on interconnected lines SA and SB into respective currents $I_A$ and $I_B$ transmitted on lines LA and LB. The difference between currents $I_A$ and $I_B$ is representative of the input signal when $V_{CM}$ is in the middle and high ranges where the operating current is at a constant supply level $I_L$. As $V_{CM}$ drops into the low range, first one and then the other of transistors Q1 and Q2 turn off to shut down current source 14.

Similarly, differential portion 12 has PNP transistors Q3 and Q4 which divide operating current provided from current source 16 on interconnected lines SC and SD into respective currents $I_C$ and $I_D$ transmitted on lines LC and LD. The difference between currents $I_C$ and $I_D$ is representative of the input signal when $V_{CM}$ is in the low and middle ranges where the operating current for transistors Q3 and Q4 is at a constant supply level $I_H$. They turn off to shut down current source 16 when $V_{CM}$ goes into the high range. Accordingly, portions 10 and 12 are both active in the middle range, but only one is active in each end range.

A measure of the amplification capability of a differential amplifier is its transconductance $G_{MA}$ (i.e., the ratio of the incremental change in total current through the input section to input voltage change $\Delta V$). Inasmuch as the individual transconductance of a bipolar transistor is approximately proportional to its collector current, $G_{MA}$ for FIG. 1 is approximately proportional to $I_A+I_B+I_C+I_D$. The total supply current transmitted by current sources 14 and 16 is the sum of the operating currents which, in turn, largely equals the sum of currents $I_A-I_D$. Since the current supply for the input section partly shuts down when $V_{CM}$ is in either end range, the total supply current is greater when $V_{CM}$ is in the middle range. The amplifier transconductance then varies in the same manner.

While the rail-to-rail input capability of the foregoing amplifier is advantageous, the $G_{MA}$ variation as $V_{CM}$ moves across the $V_{PS}$ range is sometimes a disadvantage. The variation in transconductance makes it difficult to optimize the frequency compensation for the amplifier when used in an op amp with negative feedback. Signal distortion occurs when one of current sources 14 and 16 shuts down. It would be desirable to have a differential amplifier arranged in a relatively simple configuration that achieves rail-to-rail input capability without $G_{MA}$ varying greatly across the supply range.

DISCLOSURE OF THE INVENTION

In accordance with the invention, an amplifier for amplifying a differential input signal has rail-to-rail input capability with a transconductance that can be controlled as the common-mode voltage of the input signal varies across the power supply range. The amplifier transconductance is preferably controlled to be largely constant. This facilitates optimization of the frequency response by enabling the loop gain to be largely constant when the amplifier is used with a negative feedback network.

The configuration of the amplifier is quite simple. It typically uses just a few more transistors than the prior art device described above. Consequently, the present amplifier is especially suited for use as an op amp input stage in low power supply applications.

This amplifier operates between first and second supply voltages whose $V_{PS}$ range is divided into three ranges. A first end range extends from the first supply voltage to a first specified voltage between the supply voltages. A middle range extends from the first specified voltage to a second specified voltage between the first specified voltage and the second supply voltage. A second end range extends from the second specified voltage to the second supply voltage.

The amplifier has first and second differential portions that together provide representative signal amplification across the full $V_{PS}$ range. As used herein to describe the relationship between two signals, "representative" means that their amplitudes have substantially a one-to-one (typically linear) relationship as long as the amplitudes are not too great.

The first differential portion amplifies the input signal by largely dividing a first operating current into a pair of internal currents whose difference is representative of the input signal when $V_{CM}$ varies across the middle and second ranges. Similarly, the second differential portion amplifies the input signal by largely dividing a second operating current into a pair of internal currents whose difference is representative of the input signal when $V_{CM}$ varies across the first and middle ranges. A summing circuit selectively combines the internal currents to generate at least one output signal.

Each differential portion has a pair of like-polarity input transistors. They differentially respond to the input signal to jointly control current flow between a pair of respective supply lines and a pair of respective internal lines that respectively provide the internal currents for that differential portion. The supply lines for the first portion are coupled together to carry the first operating current which is normally zero when $V_{CM}$ is in the first range. The supply lines for the second portion are likewise coupled together to carry the second operating current which is normally zero when $V_{CM}$ is in the second range. Transconductance regulation is achieved with a current control that provides amplifier supply current to generate the operating currents. The current control steers at least part of the supply current away from at least one of the differential portions when $V_{CM}$ is in at least one part of the supply range. The operating currents are regulated at values dependent on the steering of the supply current. When, for example, the differential portions are embodied in bipolar technology, the current control optimally maintains the sum of the operating currents largely constant as $V_{CM}$ varies across the rail-to-rail range. This enables the amplifier transconductance to be largely constant.

The basic technique involves diverting at least part of the supply current away from the supply lines for one of the differential portions as $V_{CM}$ goes into the end range where the input transistors in that differential portion are non-conductive. This is preferably done with one or more steering transistors differentially configured with respect to one or both pairs of input transistors. The supply lines for the other differential portion are then provided with current derived from the current diverted away. As a result, the portion of the current control that provides the supply current normally does not partially shut down. This reduces signal distortion in negative feedback applications.

BRIEF DESCRIPTION OF THE DRAWINGS

Like reference symbols are employed to identify the same or very similar item or items in the drawings and description of the preferred embodiments.

DESCRIPTION OF THE PREFERRED EMBODIMENTS

Figure 2:
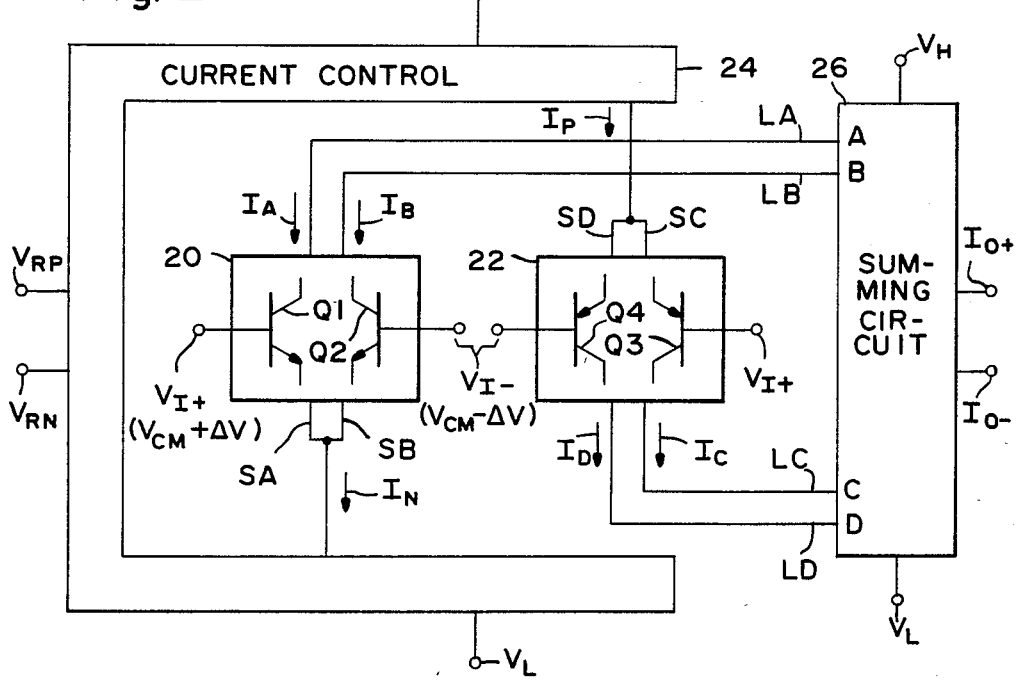
FIG. 2 is a block diagram of a differential amplifier in accordance with the invention.

Referring to the drawings, FIG. 2 shows a general differential amplifier having rail-to-rail input capability with controlled transconductance. This amplifier has a differential input section consisting of a pair of differential input portions 20 and 22 that commonly receive the differential input signal formed by voltages $V_{I+}$ and $V_{I-}$. A current control 24 responsive to one or both of control voltages $V_{RN}$ and $V_{RP}$ is connected between points for low and high supply voltages $V_L$ and $V_H$. A summing circuit 26 connected between the $V_L$ and $V_H$ terminals provides one or more output current signals representative of the input signal.

Differential portion 20 contains identical like-polarity input transistors Q1 and Q2, while differential portion 22 contains identical like-polarity input transistors Q3 and Q4. Although transistors Q1–Q4 are shown as bipolar transistors, they may be field-effect transistors (FET's) of the insulated-gate or junction type. Transistors Q3 and Q4 are typically complementary to transistors Q1 and Q2, particularly if the amplifier is embodied in bipolar or CMOS technology. Transistors Q1–Q4 may, however, all be of the same polarity in some circumstances. For example, transistors Q1 and Q2 could be depletion-mode FET's, while transistors Q3 and Q4 are enhancement-mode FET's.

A transistor such as any of transistors Q1–Q4 or the other transistors described below has a first flow electrode, a second flow electrode, and a control electrode for regulating current transmission between the flow electrodes. For a bipolar transistor its base, emitter, and collector are respectively the control, first, and second electrodes. These are the gate, source, and drain for an FET.

Transistors Q1–Q4 are all turned on when $V_{CM}$ is in a middle range extending from a specified voltage greater than $V_L$ to a specified voltage less than $V_H$. Transistors Q1 and Q2 are also conductive when $V_{CM}$ is in a high range extending from the top of the middle range to $V_H$. They are non-conductive when $V_{CM}$ is in part or all of a low range extending from the bottom of the middle range to $V_L$. The reverse is true for transistors Q3 and Q4. They are turned on in the low range but are turned off in part or all of the high range.

Responsive to the input signal differentially supplied to their control electrodes, transistors Q1 and Q2 jointly control current flow between supply and internal lines SA and LA and between supply and internal lines SB and LB. Lines SA and SB are connected together to carry an operating current $I_N$ for portion 20. It amplifies the input signal by largely dividing operating current $I_N$ into internal currents $I_A$ and $I_B$ which are respectively transmitted on lines LA and LB and whose difference is representative of the input signal when $V_{CM}$ is in the middle and high ranges. For the low range, current $I_N$ is substantially zero so that portion 20 provides no signal amplification.

Responsive to the input signal differentially supplied to their control electrodes, transistors Q3 and Q4 jointly control current flow between supply and internal lines SC and LC and between supply and internal lines SD and LD. Lines SC and SD are similarly connected together to carry an operating current $I_p$ for portion 22. It amplifies the input signal by largely dividing operating current $I_p$ into internal currents $I_C$ and $I_D$ which are respectively transmitted on lines LC and LD and whose difference is representative of the input signal when $V_{CM}$ is in the low and middle ranges. For the high range, current $I_p$ is substantially zero so that portion 22 provides no signal amplification.

For purpose of illustration, the direction of current flow for currents $I_A$ and $I_B$ is indicated as being toward portion 20 in FIG. 2, whereas the flow direction for currents $I_C$ and $I_D$ is shown as being away from portion 22. Depending on the configuration of portion 20, the flow direction for currents $I_A$ and $I_B$ may, however, be opposite to that shown. In this case, the flow direction for current $I_N$ is also reversed from that shown. The same holds for currents $I_C$, $I_D$, and $I_p$. Their flow directions with respect to portion 22 may all be reversed depending on its configuration.

Figure 1:
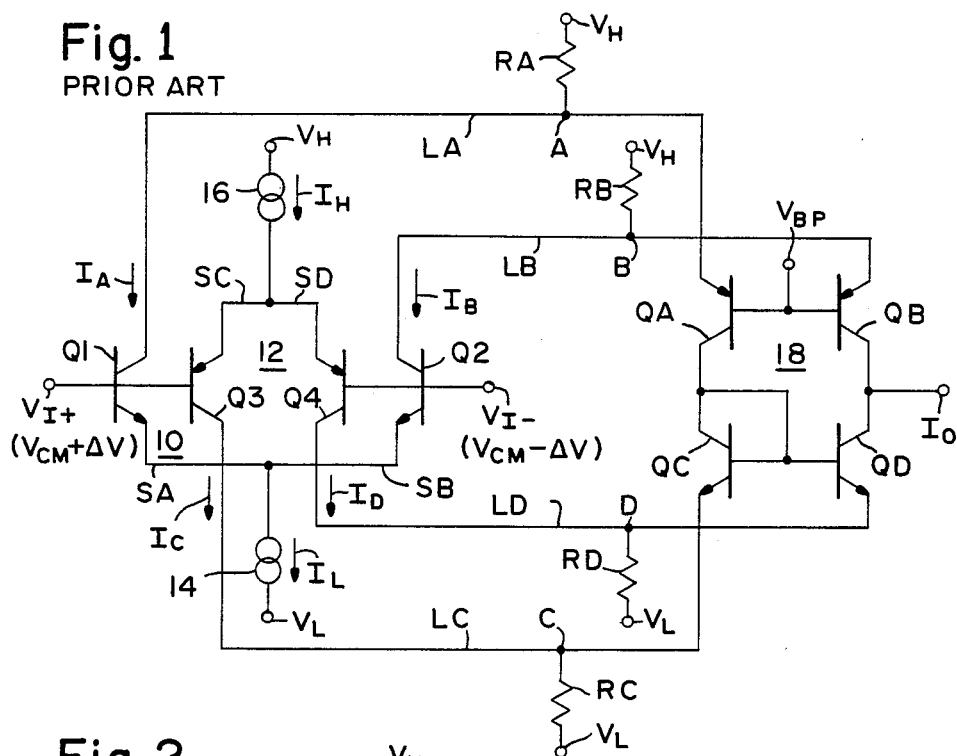
FIG. 1 is a circuit diagram of a prior art differential amplifier.

Summing circuit 26 receives the currents on internal lines LA–LD at respective nodes A, B, C, and D and suitably combines these currents to generate one or more output currents. Complementary output currents $I_{O+}$ and $I_{O-}$ may be provided if circuit 26 is a double-ended device as indicated in FIG. 2. Circuit 26 could also be a single-ended device (such as depicted in FIG. 1) that provides single output current $I_O$.

Current control 24 provides amplifier supply current that is utilized in generating operating currents $I_N$ and $I_p$ for the differential input section. The supply current is substantially constant when $V_{CM}$ is in the rail-to-rail range. The portion of control 24 that provides the supply current normally does not partially shut down in any part of the $V_{PS}$ range.

Current control 24 which is connected to portion 20 by way of lines SA and SB and to portion 22 by way of lines SC and SD controls the transconductance of the amplifier by regulating operating currents $I_N$ and $I_p$. When $V_{CM}$ is in at least one part of the $V_{PS}$ range, control 24 steers at least part of the supply current through itself and provides currents $I_N$ and $I_p$ at values depending on the steering of the supply current. In particular, control 24 operates by steering supply current away from one of portions 20 and 22 as $V_{CM}$ goes into the end range where the input transistors of that differential portion turn off and provides the other of portions 20 and 22 with current derived from the current steered away. This steering may be done with either or both of portions 20 and 22. The discussion below of particular embodiments of the amplifier of FIG. 2 further clarifies the steering mechanism.

Figure 3A:
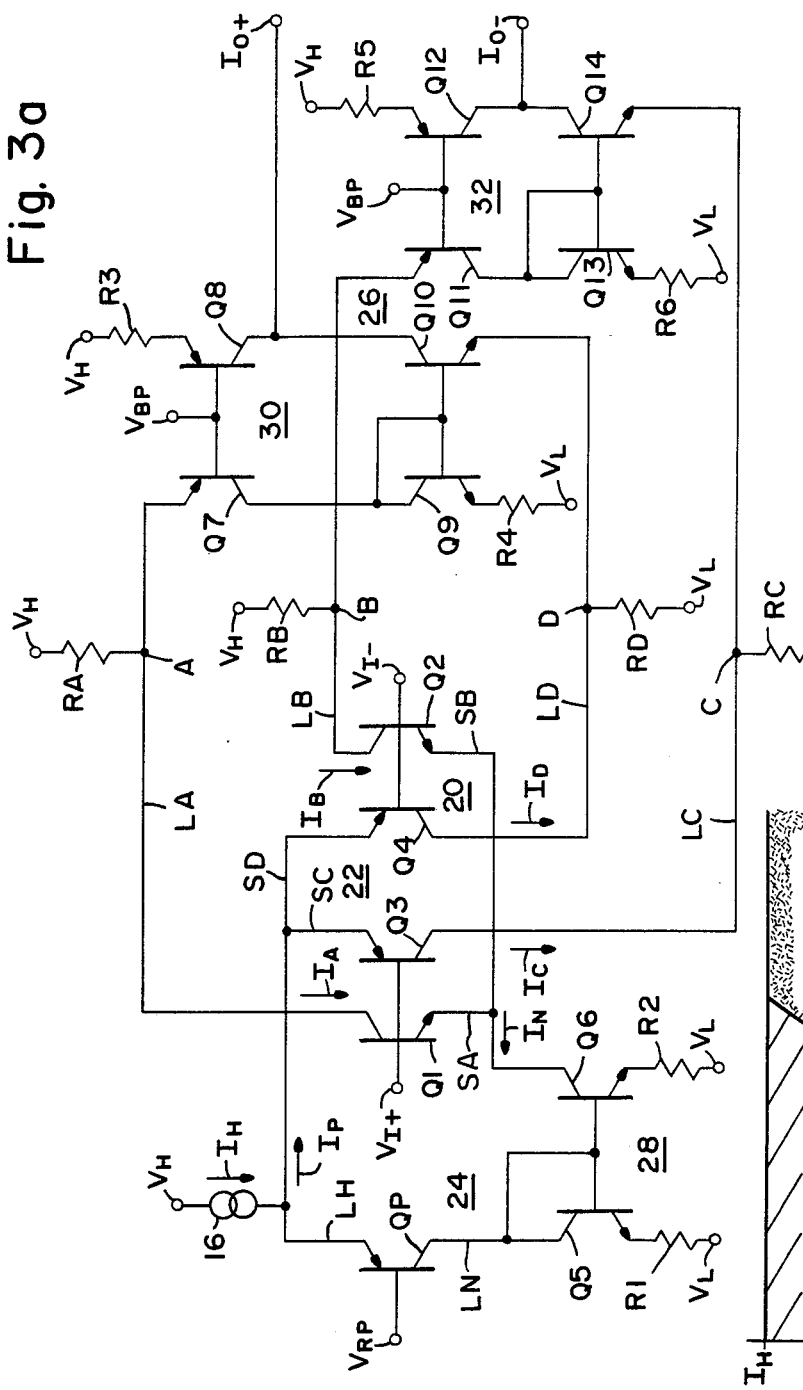
FIGS. 3a, 4a, and 5a are circuit diagrams of three different bipolar embodiments of part or all of the amplifier of FIG. 2, and FIGS. 3b, 4b, and 5b are respective asymptotic graphs of operating currents as a function of $V_{CM}$ for these embodiments.

FIG. 3a shows an embodiment of FIG. 2 in which transistors Q1 and Q2 are NPN transistors whose bases receive the input signal, whose emitters are respectively connected to lines SA and SB to receive current $I_N$, and whose collectors are respectively connected to lines LA and LB to provide currents $I_A$ and $I_B$. Transistors Q3 and Q4 are PNP transistors whose bases receive the input signal, whose emitters are respectively connected to lines SC and SD to receive current $I_p$, and whose collectors are respectively connected to lines LC and LD to provide currents $I_C$ and $I_D$.

Control 24 in FIG. 3a consists of current source 16 that provides the amplifier supply current at constant level $I_H$, a current mirror 28, and a PNP steering transistor QP. Reference voltage $V_{RP}$ is supplied to the base of transistor QP. Its emitter is connected to a steering line LH connected in common with lines SC and SD to current source 16. This places transistor QP in a differential configuration with transistors Q3 and Q4.

Mirror 28 contains identical NPN transistors Q5 and Q6 whose bases are connected to the Q5 collector which is connected through a steering line LN to the QP collector. The Q6 collector is connected to lines SA and SB. The emitters of transistors Q5 and Q6 are coupled through respective equal-valued resistors R1 and R2 to the $V_L$ terminal. Resistors R1 and R2 reduce sensitivity to noise.

The current flow through transistor QP is in the wrong direction for providing current by way of lines SA and SB to transistors Q1 and Q2. Mirror 28 largely mirrors (duplicates) the current on line LN at the Q5 collector and provides the mirrored current at the Q6 collector in the right direction for transistors Q1 and Q2.

Figure 3B:
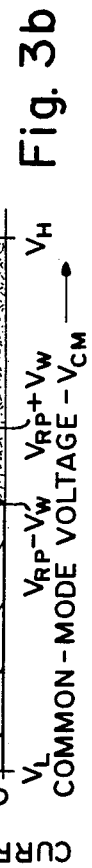

FIG. 3b shows a graph helpful in understanding the operation of control 24 in FIG. 3a. Voltage $V_{RP}$ is at a selected value within the range extending from $V_L + V_{BE} + V_{SM}$ to $V_H - V_{BE} - V_{SM}$ where $V_{SM}$ is a small safety-margin voltage typically about 0.2–0.3 volt. $V_{PS}$ must be at least $2V_{BE} + 2V_{SM}$. $V_{BE}$ is about 0.6–0.8 volt. The middle range where transistors Q1–Q4 are all conductive is an approximate 50-millivolt range centering on voltage $V_{RP}$. This is the case when the QP emitter area equals the sum of the emitter areas of transistors Q3 and Q4. Letting $2V_W$ (which equals 50 millivolts) be the width of the middle range, it extends from $V_{RP} - V_W$ to $V_{RP} + V_W$. As the QP emitter-base voltage rises from $V_{BE} - V_W$ to $V_{BE} + V_W$, transistor QP switches from substantially fully off to fully on, while transistors Q3 and Q4 do the opposite.

In the following discussion for this embodiment as well as the similar discussions below of other embodiments, base currents are ignored in comparison to collector or emitter currents. To the extent that base currents are involved, indicated equalities mean that items indicated as being equal are only largely equal. In addition, the various graphs only show asymptotes for the variation of currents $I_N$ and $I_p$. The rounding that occurs at the ends of the middle ranges is generally not shown in these graphs.

In the low $V_{CM}$ range where transistors Q3 and Q4 are turned on, transistor QP is off since its emitter-base voltage is less than $V_{BE} - V_W$. Current source 16 supplies current $I_p$ to portion 22 at level $I_H$. The sum of currents $I_C$ and $I_D$ is thereby $I_H$. Transistors Q5 and Q6 are off because transistor QP is off. Since current $I_N$ is thereby zero, transistors Q1 and Q2 are off.

As $V_{CM}$ moves up through the middle range, transistor QP turns on and progressively becomes more conductive. It steers a progressively increasing part of current $I_H$ away from transistors Q3 and Q4, causing them to become progressively less conductive as current $I_p$ progressively decreases toward zero. The $I_H$ part steered away from portion 22 is transmitted through transistor QP to transistor Q5 so as to turn on transistors Q5 and Q6. Mirror 28 duplicates this $I_H$ part and provides the duplicated current portion by way of lines SA and SB to transistors Q1 and Q2 which progressively turn on. Current $I_N$ which equals the duplicated $I_H$ part progressively increases towards level $I_H$.

When $V_{CM}$ is in the high range, all of current $I_H$ is steered away from transistors Q3 and Q4 so that they are off and current $I_p$ is zero. Transistor QP is fully on and steers all of current $I_H$ to mirror 28. It provides current $I_N$ to portion 20 at a value equal to $I_H$. The sum of currents $I_A$ and $I_B$ thereby equals $I_H$.

As shown in FIG. 3b, the sum of currents $I_A-I_D$ is $I_p+I_N$ which equals the constant supply current $I_H$ across the entire rail-to-rail range for $V_{CM}$. The transconductance $G_{MA}$ of the amplifier of FIG. 3a is approximately $(I_A+I_B+I_C+I_D)/V_T$ which equals $I_H/V_T$. $V_T$ is $kT/q$ where T is temperature, k is Boltzmann's constant, and q is the electronic charge. As a result, $G_{MA}$ is largely constant across the $V_{PS}$ range.

Summing circuit 26 in FIG. 3a contains a modulated current mirror 30 consisting of transistors Q7, Q8, Q9, and Q10, an identical modulated current mirror 32 consisting of transistors Q11, Q12, Q13, and Q14, and equal-valued resistors RA-RD and R3, R4, R5, and R6 connected as shown to provide complementary currents $I_{O+}$ and $I_{O-}$. The bases of transistors Q7, Q8, Q11, and Q12 receive bias voltage $V_{BP}$. Mirrors 30 and 32 operate in the manner described in U.S. patent application Ser. No. 525,181, cited above, except that transistors Q8, Q9, Q12, and Q13 do not receive signal inputs. When the differential portion of the input signal changes from zero to $2\Delta V$, currents $I_A-I_D$ change by respective increments $\Delta I_N, -\Delta I_N, -\Delta I_p$, and $\Delta I_p$ which are all non-zero only in the middle range. However, $G_{MA}$ is $2(\Delta I_N+\Delta I_p)/\Delta V$ which approximately equals $I_H/V_T$ across the entire supply range.

That is, $2(\Delta I_N+\Delta I_p)/\Delta V$ is substantially constant across the $V_{PS}$ range regardless of the individual values of $\Delta I_N$ and $\Delta I_p$. Accordingly, currents $I_{O+}$ and $I_{O-}$ which respectively equal $\Delta I_N+\Delta I_p$ and $-\Delta I_N-\Delta I_p$ are not a function of the location of $V_{CM}$ in the $V_{PS}$ range.

Figure 4A:
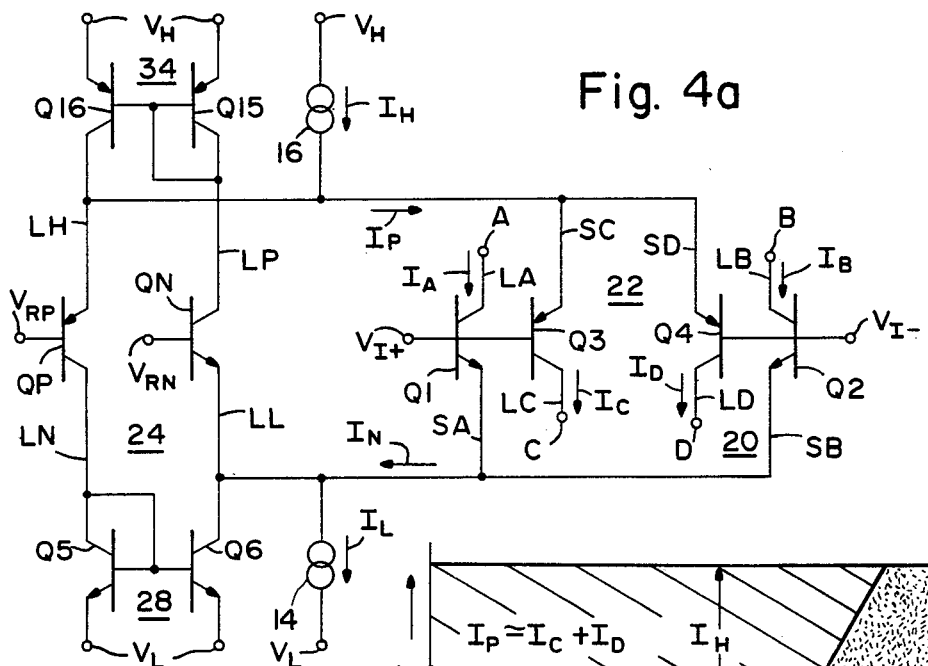

FIG. 4a depicts a partial embodiment of the present amplifier in which portions 20 and 22 are configured the same as in FIG. 3a. The principal difference is in current control 24 where current sources 14 and 16 provide supply currents at constant levels $I_L$ and $I_H$. The amplifier supply current for the differential input section is the sum of $I_L$ and $I_H$. A summing circuit (not shown in FIG. 4a) is connected to nodes A-D of the input section to generate the output current(s).

Control 24 in FIG. 4a contains transistor QP and mirror 28 configured the same as in FIG. 3a except that anti-noise resistors R1 and R2 are omitted in FIG. 4a. Control 24 further includes a current mirror 34 and an NPN steering transistor QN. Reference voltage $V_{RN}$ is supplied to the base of transistor QN. Its emitter is connected to steering line LL connected in common with lines SA and SB to current source 14. This places transistor QN in a differential configuration with transistors Q1 and Q2. Mirror 34 contains identical PNP transistors Q15 and Q16 whose bases are connected to the Q15 collector which is connected through a steering line LP to the QN collector. The Q16 collector is connected to lines SC and SD. The emitters of transistors Q15 and Q16 are tied to the $V_H$ terminal.

Figure 4B:
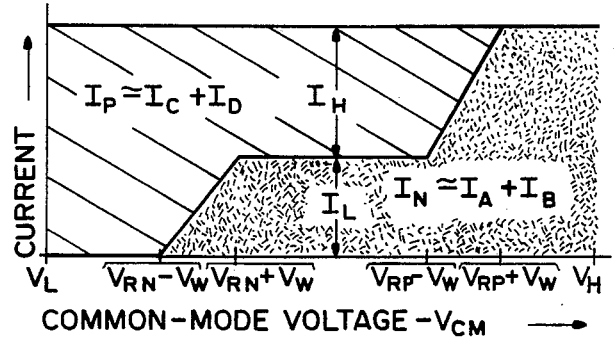

FIG. 4b shows a graph that facilitates understanding the operation of control 24 in FIG. 4a. Voltage $V_{RP}$ and $V_{RN}$ are both at selected values within the range extending from $V_L+V_{BE}+V_{SM}$ to $V_H-V_{BE}-V_{SM}$. $V_{RN}$ is less than $V_{RP}-2V_W$. $V_{PS}$ is again at least $2V_{BE}+2V_{SM}$. The middle range extends from $V_{RN}-V_W$ up to $V_{RP}+V_W$. As the QN base-emitter voltage drops from $V_{BE}+V_W$ to $V_{BE}-V_W$ (at the lower portion of the middle range), transistor QN switches from fully on to substantially fully off while transistors Q1 and Q2 do the opposite. As the QP emitter-base voltage rises from $V_{BE}-V_W$ to $V_{BE}+V_W$ (at the upper portion of the middle range), transistor QP switches from substantially fully off to fully on while transistors Q3 and Q4 do the reverse.

In the low $V_{CM}$ range, transistors Q1 and Q2 are off so that current $I_N$ is zero. Transistor QN is on and steers current $I_L$ away from portion 20 to transistor Q15 so as to turn on transistors Q15 and Q16. Mirror 34 duplicates current $I_L$ at the Q15 collector and provides the duplicated current from the Q16 collector to portion 22. Transistors Q5 and Q6 are off since transistor QP is off. Current source 16 then provides current $I_H$ directly to portion 22. As a result, current $I_p$ equals $I_L+I_H$.

As $V_{CM}$ moves up through the lower middle-range portion extending from $V_{RN}-V_W$ to $V_{RN}+V_W$, transistor QN becomes progressively less conductive and steers a progressively decreasing part of current $I_L$ away from transistors Q1 and Q2. Mirror 34 duplicates the $I_L$ part steered away from portion 20 and supplies the duplicated current to portion 22 so that current $I_p$ progressively decreases toward $I_H$. Meanwhile, current source 14 provides a progressively increasing part of current $I_L$ to transistors Q1 and Q2, causing them to turn on and become progressively more conductive. Current $I_N$ progressively increases toward $I_L$.

In the central middle-range portion extending from $V_{RN}+V_W$ to $V_{RP}-V_W$, transistors QN and QP are both off. Mirrors 28 and 34 are therefore both off. No steering occurs. Current source 14 provides current $I_N$ to portion 20 at level $I_L$. Current source 16 provides current $I_p$ to portion 22 at level $I_H$.

In the upper middle-range portion extending from $V_{RP}-V_W$ to $V_{RP}+V_W$ and in the high $V_{CM}$ range, transistor QN and mirror 28 operate on current $I_H$ in the same way that transistor QP and mirror 34 respectively operate on current $I_L$ in the lower middle-range portion and in the low range. In particular, current $I_p$ decreases progressively toward zero and then stays there as $V_{CM}$ rises through the upper middle-range portion and the high range. Current $I_N$ increases progressively towards $I_L+I_H$ and then stays there.

The sum of currents $I_A-I_D$ is constant at level $I_L+I_H$. The transconductance for FIG. 4 is therefore constant when $V_{CM}$ varies across the rail-to-rail range.

Figure 5A:
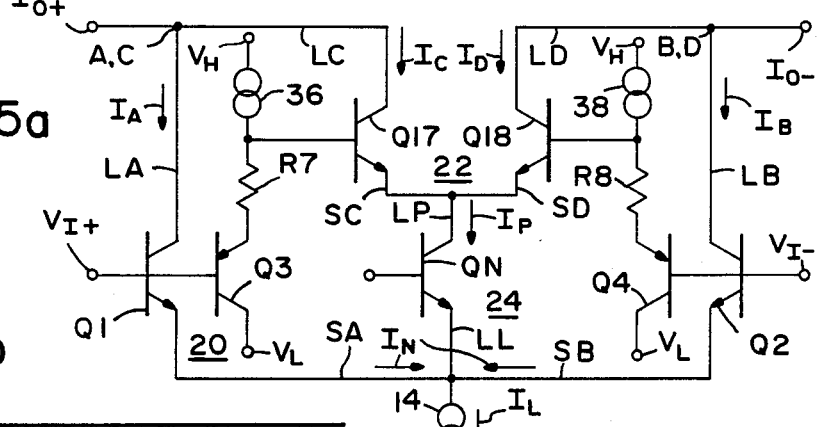

FIG. 5a shows an embodiment of the present amplifier in which portion 20 is configured the same as in FIG. 4a, but portion 22 is configured differently. Portion 22 in FIG. 5a contains a level shifter that translates the input signal into a shifted differential signal whose common-mode voltage is at least $1V_{BE}$ closer to $V_H$. The level shifter contains PNP transistors Q3 and Q4 whose bases differentially receive the input signal and whose collectors are connected to the $V_L$ supply point. The emitters of transistors Q3 and Q4 are connected to the lower ends of respective resistors R7 and R8 whose upper ends provide the shifted differential signal and are respectively coupled through constant current sources 36 and 38 to the $V_H$ supply point. The shifted signal is differentially supplied to the bases of identical NPN transistors Q17 and Q18. Their collectors are respectively connected to lines LC and LD to provide currents $I_C$ and $I_D$, and their emitters are respectively connected to lines SC and SD to carry current $I_P$.

The direction of current flow in lines LA and LB relative to portion 20 is the same as the direction of current flow in lines LC and LD relative to portion 22. Accordingly, a double-ended summing circuit is achieved by simply connecting lines LA and LC together to provide output $I_{O+}$ and by connecting lines LB and LD together to provide output $I_{O-}$.

Control 24 in FIG. 5a consists of current source 14 and NPN steering transistor QN whose base receives voltage $V_{RN}$. The QN collector is connected through line LP to lines SC and SD. The QN emitter is connected to line LL connected commonly with lines SA and SB to current source 14 so that transistor QN is in a differential configuration with transistors Q1 and Q2.

Figure 5B:
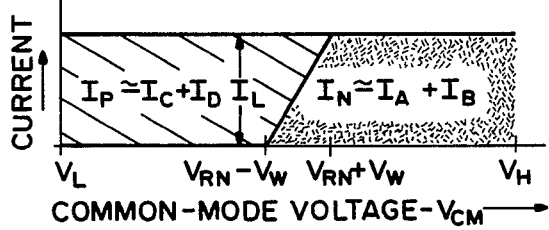

FIG. 5b shows a graph helpful in understanding the operation of control 24 in FIG. 5a. Voltage $V_{RN}$ is at a selected value within the range extending from $V_L+V_{BE}+V_{SM}$ to $V_H-V_{BE}-V_{SM}$. In the low range where transistors Q1 and Q2 are off, transistor QN is on along with transistors Q3 and Q4. The shifted signal is provided to transistors Q17 and Q18 which are also on. Transistor QN diverts current $I_L$ from current source 14 away from portion 20 to portion 22 to generate current $I_P$ at level $I_L$. As $V_{CM}$ moves through the middle range extending from $V_{RN}-V_W$ to $V_{RN}+V_W$, transistor QN becomes progressively less conductive and does progressively less current steering, while transistors Q1 and Q2 turn on and become progressively more conductive. Current $I_N$ progressively increases from zero to $I_L$. Current $I_P$ does the reverse. In the high range, transistor QN is off so that transistors Q17 and Q18 are off. Current source 14 supplies current $I_N$ to portion 20 at level $I_L$. If $V_{CM}$ rises high enough, transistors Q3 and Q4 turn off. This, however, does not affect operation in the high range.

The sum of currents $I_A-I_D$ constant at level $I_L$. As a result, $G_{MA}$ for FIG. 5a is largely constant.

Figure 6:
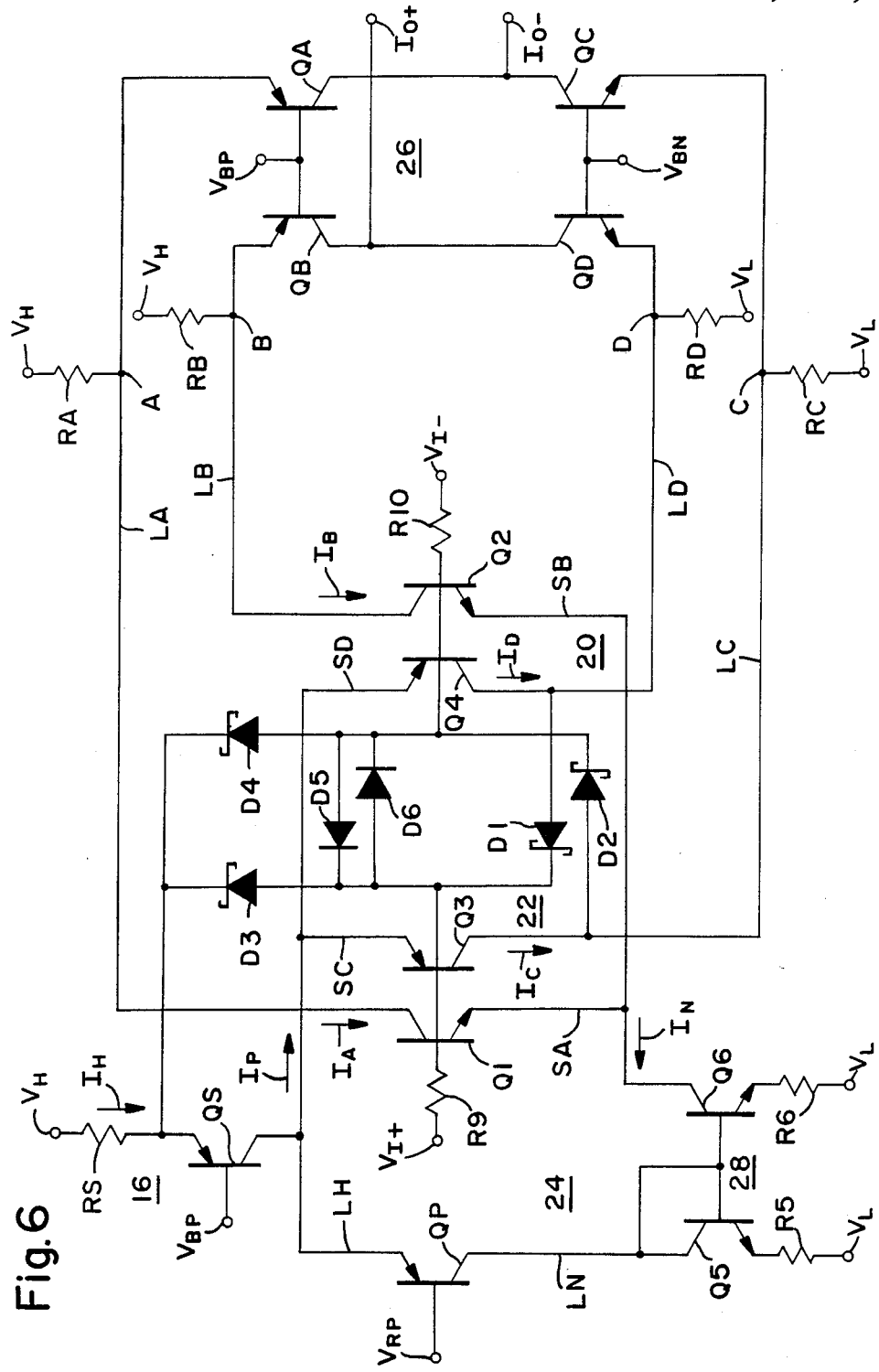
FIG. 6 is a circuit diagram of a preferred bipolar embodiment of the amplifier of FIG. 2.

FIG. 6 illustrates a preferred embodiment of the amplifier of FIG. 2 in which portions 20 and 22 and control 24 are configured as in FIG. 3a except that the input signal is supplied through resistors R9 and R10 to portions 20 and 22. Current source 16 consists of a PNP transistor QS and a resistor RS connected as shown.

Summing circuit 26 in FIG. 6 contains PNP transistors QA and QB and NPN transistors QC and QD connected as shown in FIG. 1 except that the bases of transistors QC and QD receive a bias voltage $V_{BN}$. This enables circuit 26 to provide output $I_{O+}$ from the QB and QD collectors and output $I_{O-}$ from the QA and QC collectors.

Circuit 26 in FIG. 6 operates as follows. As seen from line LA, resistor RA is a high impedance whereas transistor QA is a low impedance. The same holds for lines LB-LD with respect to resistors RB-RD and transistors QB-QD. When incremental currents $\Delta I_N$, $-\Delta I_N$, $-\Delta I_P$, and $\Delta I_P$ occur respectively on lines LA-LD, opposite incremental currents respectively flow through transistors QA-QD. As a result, currents $I_{O+}$ and $I_{O-}$ respectively equal $\Delta I_N+\Delta I_P$ and $-\Delta I_N-\Delta I_P$. Since $G_{MA}$ which equals $2(\Delta I_N+\Delta I_P)/\Delta V$ is constant across the rail-to-rail range, currents $I_{O+}$ and $I_{O-}$ are largely independent of the location of $V_{CM}$ in the $V_{PS}$ range.

A set of Schottky diodes D1, D2, D3, and D4 in combination with resistors R9 and R10 prevents the polarities of outputs $I_{O+}$ and $I_{O-}$ from inverting when $V_{CM}$ drops below $V_L$ or rises above $V_H$. Typically, this protection occurs in ranges extending about 10 volts below $V_L$ and 10 volts above $V_H$. Diodes D1 and D2 are cross coupled as shown between transistors Q3 and Q4. Diodes D3 and D4 are connected between current source 16 and respective resistors R9 and R10.

A pair of PN diodes D5 and D6 in combination with resistors R9 and R10 prevent large Zener currents from detrimentally affecting transistors Q1-Q4 when the differential part ($2\Delta V$) of the input signal becomes too large. Diodes D5 and D6 are connected in parallel in opposing directions between resistors R9 and R10. Each of diodes D5 and D6 is preferably an NPN transistor having its base connected to its collector.

In FIG. 6, voltages $V_H$ and $V_L$ are preferably greater than 0.9 volt and less than −0.9 volt. Voltage $V_{RP}$ or $V_{BN}$ is 0.8 volt above $V_L$, and voltage $V_{BP}$ is 0.8 volt below $V_H$. Resistors R5/R6, R9/R10, RA/RB/RC/RD and RS are respectively 1,000, 3,000, 50,000, and 50,000 ohms.

In portions 20 and 22, as for example, embodied in FIGS. 3a-5a or 6, each pair of corresponding transistors such as transistors Q1 and Q2 may be replaced with a pair of groups of transistors arranged in identical voltage following configurations. Such a bipolar group typically consists of a lead transistor whose emitter is coupled directly or through one or more other transistors to the base of a trailing transistor. The input signal to the group is supplied to the base of the leading transistor to control current flow between lines connected to the emitter and collector of the trailing transistor. In a pair of corresponding transistors in portion 20 or 22 is in a differential configuration with a steering transistor in control 24, that transistor may also be replaced with a group of transistors arranged in a corresponding voltage following configuration.

Figure 7:
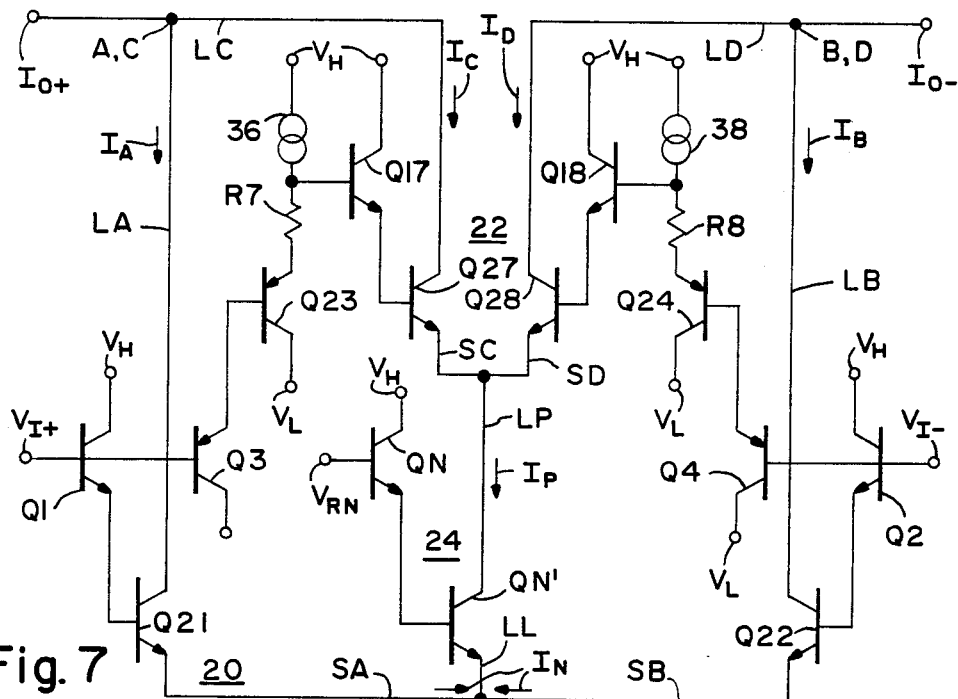
FIG. 7 is a circuit diagram of a bipolar embodiment of part of the amplifier of FIG. 2 in which Darlington transistor pairs are employed.

FIG. 7 illustrates how this replacement can be done in the embodiment of FIG. 5a. As indicated in FIG. 7, transistor Q1 is replaced with a Darlington transistor pair in which the emitter of transistor Q1 is connected to the base of an NPN transistor Q21 whose emitter and collector are respectively connected to lines SA and LA. Voltage $V_{I+}$ is still provided to the base of transistor Q1 but its collector is tied to the $V_H$ terminal. Transistor Q2 is replaced in the same manner with a Darlington pair consisting of transistor Q2 and an NPN transistor Q22 which is identical to transistor Q21. Transistors Q3, Q4, Q17, and Q18 are similarly replaced with Darlington pairs respectively consisting of transistor Q3 and a PNP transistor Q23, transistor Q4 and a PNP transistor Q24 identical to transistor Q23, transistor Q17 and an NPN transistor Q27, and transistor Q18 and an NPN transistor Q28 identical to transistor Q27. Since transistors Q1 and Q2 in FIG. 5a are in a differential configuration with transistor QN, it is is normally replaced in the same manner with a Darlington pair consisting of transistor QN and an NPN transistor QN'.

Because Darlingtons are used in portions 20 and 22 in FIG. 7, $V_{PS}$ must be at least $4V_{BE}+2V_{SM}$. Voltage $V_{RN}$ is at a selected value within the range extending from $V_L+2V_{BE}V_{SM}$ to $V_H-2V_{BE}-V_{SM}$. Alternatively, voltage $V_{RN}$ could be reduced 1 $V_{BE}$ instead of replacing transistor QN with a Darlington pair. Aside from the foregoing differences, the amplifier of FIG. 7 operates the same as described above for the amplifier of FIG. 5a.

Figure 8A:
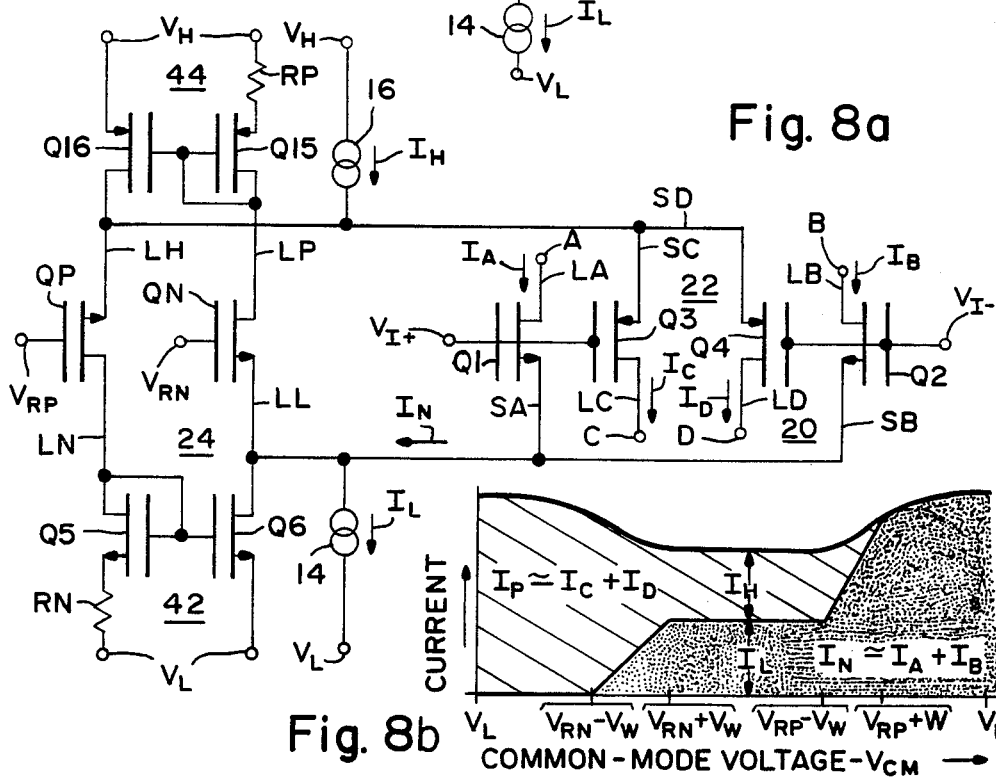
FIG. 8a is a circuit diagram of a complementary metal-oxide semiconductor (CMOS) embodiment of part of the amplifier of FIG. 2.

The present amplifier may be embodied partly or wholly with FET's. FIG. 8a depicts a partial embodiment similar to that of FIG. 4a but using CMOS technology. All the transistors in FIG. 8a are preferably enhancement-mode MOS FET's. Each N-channel FET is indicated by an arrow on its source pointing away from the FET. Each P-channel FET is indicated by an arrow on its source pointing toward the FET.

The input section in FIG. 8a contains portions 20 and 22 interconnected with control 24 in the same way as the corresponding items are interconnected in FIG. 4a. Mirror 28 of FIG. 4a is replaced with a reversing circuit 42 in which a resistor RN is connected between the Q5 source and the $V_L$ terminal. Circuit 42 provides the Q6 drain with current of greater magnitude than, but opposite flow direction to, the current through the Q5 drain. Similarly, mirror 34 is replaced with a reversing circuit 44 in which a resistor RP is connected between the Q15 source and the $V_H$ supply point. Circuit 44 provides the Q16 drain with current of greater magnitude than, but opposite flow direction to, the current through the Q15 drain. The current amplifications in circuit 42 and 44 depend on the values of resistors RN and RP. Control 24 then consists of current sources 14 and 16, transistors QN and QP, and circuits 42 and 44.

Figure 8B:
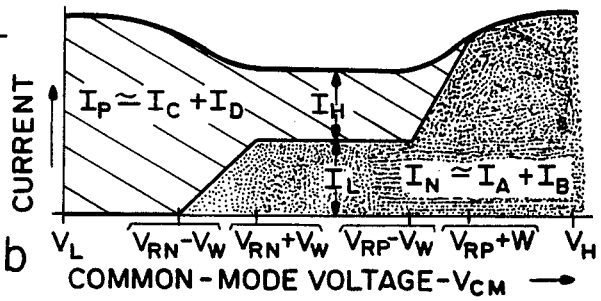
FIG. 8b is an asymptotic graph of operating currents as a function of $V_{CM}$ for this embodiment.

FIG. 8b shows a graph that facilitates understanding the operation of control 24 in FIG. 8a. The operation is generally the same as that of FIG. 4a. The $V_{CM}$ ranges are qualitatively the same. The width $2V_W$ of the lower and upper middle range portions depends on the types of FET's used. The steering in the input section of FIG. 8a is the same as that in FIG. 4a except for the current amplifications provided by circuits 42 and 44. In the central portion of the middle range, the sum of operating currents $I_P$ and $I_N$ equals $I_L+I_H$. Because of the current amplification at the Q16 drain, the sum of currents $I_P$ and $I_N$ progressively increases as $V_{CM}$ decreases from $V_{RN}+V_W$ to $V_L$. Likewise, the current amplification at the Q16 drain causes the sum of currents $I_P$ and $I_N$ to progressively increase as $V_{CM}$ increases from $V_{RP}+V_W$ to $V_H$. Consequently, the sum of currents $I_A-I_D$ is greater when $V_{CM}$ is at $V_L$ or $V_H$ than when $V_{CM}$ is in the middle of the supply range.

The transconductance for a MOS FET is approximately proportional to the square root of its drain current. If circuits 42 and 44 were simply current mirrors that provided no current amplification, $G_{MA}$ would decrease as $V_{CM}$ moves from the central portion of the middle range out to $V_L$ or $V_H$. The current amplification provided at the Q6 and Q16 drains increases $G_{MA}$ in the parts of the $V_{PS}$ range outside the central portion of the middle range. The $G_{MA}$ variation as $V_{CM}$ moves across the $V_{PS}$ range can be controlled upward by adjusting the amplifications of circuits 42 and 44. Suitable choice for their amplifications makes the amplifier transconductance relatively constant. As an example, $G_{MA}$ is largely constant if the amplifications of circuits 42 and 44 increase from 1 when they are just turned on to about 3 when they are fully conductive.

Furthermore, one or both of circuits 42 and 44 can be configured to give current reduction rather than amplification. $G_{MA}$ would then decrease even more as $V_{CM}$ moves outward from the central portion of the middle range. Such a $G_{MA}$ variation might be desirable in some applications.

The foregoing comments concerning transconductance regulation apply to other FET embodiments of the present invention as well as to bipolar embodiments. Within certain limits, connecting a suitable current-reversing circuit between line LN and lines SA and SB if current source 16 is used and/or connecting a suitable current-reversing circuit between line LP and lines SC and SD if current source 14 is used allow $G_{MA}$ to be regulated in a desired manner.

Methods for manufacturing the various elements of the present amplifier are well known in the semiconductor art. The amplifier is preferably fabricated as part of a monolithic integrated circuit using PN-junction isolation to separate active regions in a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Proper signal amplification typically occurs in the present amplifier when $V_{CM}$ extends somewhat outside the power supply range. Each input transistor pair can be replaced with four transistors arranged in a quad configuration to reduce the input offset voltage. Thus, various modifications, changes, and applications may be made by those skilled in the art without departing from the true scope and spirit of the invention as defined by the appended claims.

What is claimed is:

1. An amplifier operable between first and second supply voltages which define a supply range consisting of (a) a first end range extending from the first supply voltage to a first specified voltage between the supply voltages, (b) a middle range extending from the first specified voltage to a second specified voltage between the first specified voltage and the second supply voltage, and (c) a second end range extending from the second specified voltage to the second supply voltage, the amplifier having: first differential means for amplifying a differential input signal by largely dividing a first operating current into first and second internal currents whose difference is representative of the input signal when its common-mode voltage ($V_{CM}$) varies across the middle and second ranges; second differential means for amplifying the input signal by largely dividing a second operating current into third and fourth internal currents whose difference is representative of the input signal when $V_{CM}$ varies across the first and middle ranges; and summing means for selectively combining the internal currents to generate at least one output signal; characterized by control means for providing amplifier supply current to generate the operating currents and for suitably steering at least part of the supply current away from at least one of the differential means when $V_{CM}$ is in at least one part of the supply range so as to control the operating currents at values dependent on the steering of the supply current.

2. An amplifier as in claim 1 characterized in that the transconductance of the amplifier is largely constant as $V_{CM}$ varies across the supply range.

3. An amplifier as in claim 1 wherein the supply current substantially equals the sum of the operating currents, characterized in that the supply current is largely constant as $V_{CM}$ varies across the supply range.

4. An amplifier as in claim 1 characterized in that the supply current is largely constant as $V_{CM}$ varies across the supply range.

5. An amplifier as in claim 4 characterized in that the control means maintains the sum of the operating currents largely constant as $V_{CM}$ varies across the supply range.

6. An amplifier as in claim 1 wherein: each differential means has a pair of input transistors differentially responsive to the input signal; the input transistors in the first means are substantially off when $V_{CM}$ is in at least part of the first range; and the input transistors in the second means are substantially off when $V_{CM}$ is in at least part of the second range; characterized in that the control means (a) at least partially provides the operating current for at least one specified one of the differential means from the supply current, (b) diverts at least part of the supply current away from each specified differential means as $V_{CM}$ goes into the end range where the input transistors in that differential means turn substantially off, and (c) provides at least part of the operating current for the other differential means at a level derived from the current so diverted.

7. An amplifier as in claim 6 wherein the supply current substantially equals the sum of the operating currents, characterized in that the supply current is largely constant as $V_{CM}$ varies across the supply range.

8. An amplifier as in claim 1 wherein: the first means has first and second like-polarity input transistors having respective control electrodes differentially responsive to the input signal for jointly controlling current flow (a) between a first supply line and a first internal line that provides the first internal current and (b) between a second supply line and a second internal line that provides the second internal current, the first and second supply lines coupled together for carrying the first operating current which is substantially zero when $V_{CM}$ is in the first range; and the second means has third and fourth like-polarity input transistors having respective control electrodes differentially responsive to the input signal for jointly controlling current flow (c) between a third supply line and a third internal line that provides the third internal current and (d) between a fourth supply line and a fourth internal line that provides the fourth internal current, the third and fourth supply lines coupled together for carrying the second operating current which is substantially zero when $V_{CM}$ is in the second range; characterized in that the supply current is largely constant as $V_{CM}$ varies across the supply range.

9. An amplifier as in claim 8 wherein: the first and second transistors are substantially off when $V_{CM}$ is in at least part of the first range; and the third and fourth transistors are substantially off when $V_{CM}$ is in at least part of the second range; characterized in that the control means (a) at least partially provides the operating current for at least one specified one of the differential means from the supply current, (b) diverts at least part of the supply current away from each specified differential means as $V_{CM}$ goes into the end range where the input transistors in that differential means turn substantially off, and (c) provides at least part of the operating current for the other differential means at a level derived from the current so diverted.

10. An amplifier as in claim 9 wherein the supply current substantially equals the sum of the operating currents, characterized in that the transconductance of the amplifier is largely constant as $V_{CM}$ varies across the supply range.

11. An amplifier as in claim 9 characterized in that the flow direction of the first operating current relative to the first means is the same as the flow direction of the second operating current relative to the second means.

12. An amplifier as in claim 11 characterized in that the control means comprises:
a current source, coupled to a supply point for the first supply voltage, for providing the supply current; and
a steering transistor having a control electrode for receiving a reference voltage to control current flow between a pair of steering lines of which one is coupled in common with the first and second supply lines to the current source and the other is coupled to the third and fourth supply lines.

13. An amplifier as in claim 12 characterized in that the second means comprises:
shifting means for translating the input signal into a shifted differential signal whose common-mode voltage is closer than $V_{CM}$ to the second supply voltage; and
fifth and sixth like-polarity transistors having respective control electrodes differentially responsive to the shifted signal, respective first flow electrodes coupled respectively to the third and fourth supply lines, and respective second flow electrodes coupled respectively to the third and fourth internal lines.

14. An amplifier as in claim 9 wherein the flow direction of the first operating current relative to the first means is opposite to the flow direction of the second operating current relative to the second means, characterized in that the control means comprises:
a current source, coupled to a supply point for the second supply voltage, for providing the supply current;
steering means in which a steering transistor of like polarity to the third and fourth transistors has a control electrode for receiving a reference voltage to control current flow between a pair of steering lines of which one is coupled in common with the third and fourth supply lines to the current source; and
reversing means for providing an electrode thereof coupled to the first and second supply lines with current dependent on, but of opposite flow direction to, current through another electrode thereof coupled to the other steering line.

15. An amplifier as in claim 14 characterized in that the currents through the electrodes of the reversing means are of largely equal magnitude, the sum of the operating currents being largely constant as $V_{CM}$ varies across the supply range.

16. An amplifier as in claim 15 wherein: each of the first, second, third, and fourth transistors has first and second flow electrodes respectively coupled to the like-numbered supply and internal lines; characterized in that the steering transistor has a first flow electrode coupled to the particular steering line coupled to the current source and has a second flow electrode coupled to the remaining steering line.

17. An amplifier as in claim 15 characterized in that each transistor is a bipolar transistor having a base, an emitter, and a collector which respectively are the control, first, and second electrodes of that transistor, the third and fourth transistors being complementary to the first and second transistors.

18. An amplifier as in claim 16 characterized in that the supply current substantially consists of the current transmitted on the third and fourth supply lines and on the particular steering line coupled in common with them.

19. An amplifier as in claim 14 characterized by means for preventing large Zener currents from damaging the input transistors.

20. An amplifier as in claim 14 characterized by means for preventing polarity inversion of each output signal when $V_{CM}$ is within specified limits outside the supply range.

21. An amplifier as in claim 9 wherein the flow direction of the first operating current relative to the first means is opposite to the flow direction of the second operating current relative to the second means, characterized in that the control means comprises:

first and second current sources, respectively coupled to supply points for the first and second supply voltages, for respectively providing first and second supply currents whose sum is substantially the amplifier supply current;

first steering means in which a steering transistor of like polarity to the first and second transistors has a control electrode for receiving a first reference voltage to control current flow between a pair of steering lines of which one is coupled in common with the first and second supply lines to the first current source;

first reversing means for providing an electrode thereof coupled to the third and fourth supply lines with current dependent on, but of opposite flow direction to, current through another electrode thereof coupled to the other steering line of the first steering means;

second steering means in which a steering transistor of like polarity to the third and fourth transistors has a control electrode for receiving a second reference voltage to control current flow between a pair of steering lines of which one is coupled in common with the third and fourth supply lines to the second current source; and second reversing means for providing an electrode thereof coupled to the first and second supply lines with current dependent on, but of opposite flow direction to, current through another electrode thereof coupled to the other steering line of the second steering means.

22. An amplifier as in claim 21 characterized in that the currents through the electrodes of the first reversing means are of largely equal magnitude, and the currents through the electrodes of the second reversing means are of largely equal magnitude, the sum of the operating currents being largely constant as $V_{CM}$ varies across the supply range.

23. An amplifier as in claim 21 characterized in that the transistors are field-effect transistors, the third and fourth transistors being complementary to the first and second transistors.

24. An amplifier as in claim 21 characterized in that each transistor is a bipolar transistor having a base, an emitter, and a collector which respectively are the control, first, and second electrodes of that transistor, the third and fourth transistors being complementary to the first and second transistors.

* * * * *